(12) United States Patent
Kim et al.

(10) Patent No.: US 7,951,726 B2
(45) Date of Patent: May 31, 2011

(54) ORGANIC/INORGANIC HYBRID THIN FILM PASSIVATION LAYER FOR BLOCKING MOISTURE/OXYGEN TRANSMISSION AND IMPROVING GAS BARRIER PROPERTY

(75) Inventors: Jai Kyeong Kim, Seoul (KR); Jung Soo Park, Seoul (KR); June Whan Choi, Seoul (KR); Dae-Seok Na, Daegu (KR); Jae-Hyun Lim, Seoul (KR); Joo-Won Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 145 days.

(21) Appl. No.: 12/360,567

(22) Filed: Jan. 27, 2009

(65) Prior Publication Data

US 2009/0215279 A1   Aug. 27, 2009

(30) Foreign Application Priority Data

Feb. 25, 2008  (KR) ........................ 10-2008-0016888

(51) Int. Cl.
  *H01L 21/31* (2006.01)
(52) U.S. Cl. .. 438/761; 438/763; 438/780; 257/E21.242
(58) Field of Classification Search .................. 438/761, 438/763, 780, 781; 257/E21.242, E21.259
See application file for complete search history.

(56) References Cited

U.S. PATENT DOCUMENTS

| | | | | |
|---|---|---|---|---|
| 6,638,645 | B2* | 10/2003 | Sawai et al. | 428/690 |
| 7,141,277 | B1* | 11/2006 | Vaia et al. | 427/534 |
| 7,391,152 | B2* | 6/2008 | Ju et al. | 313/506 |
| 2003/0138733 | A1* | 7/2003 | Sachdev et al. | 430/311 |
| 2005/0046339 | A1* | 3/2005 | Ju et al. | 313/504 |

FOREIGN PATENT DOCUMENTS

| | | |
|---|---|---|
| JP | 2004-165513 A | 6/2004 |
| KR | 540179 | 4/2004 |
| KR | 10-2005-0036826 | 4/2005 |
| KR | 10-20050031659 A | 4/2005 |
| KR | 10-2008-0012553 | 2/2008 |

* cited by examiner

*Primary Examiner* — Tuan N. Quach
(74) *Attorney, Agent, or Firm* — Jones Day

(57) ABSTRACT

The present invention relates to an organic/inorganic hybrid thin film passivation layer comprising an organic polymer passivation layer prepared by a UV/ozone curing process and an inorganic thin film passivation layer for blocking moisture and oxygen transmission of an organic electronic device fabricated on a substrate and improving gas barrier property of a plastic substrate; and a fabrication method thereof. Since the organic/inorganic hybrid thin film passivation layer of the present invention converts the surface polarity of an organic polymer passivation layer into hydrophilic by using the UV/ozone curing process, it can improve the adhesion strength between the passivation layer interfaces, increase the light transmission rate due to surface planarization of the organic polymer passivation layer, and enhance gas barrier property by effectively blocking moisture and oxygen transmission.

18 Claims, 8 Drawing Sheets

ORGANIC/INORGANIC HYBRID THIN FILM PASSIVATION LAYER FOR BLOCKING MOISTURE/OXYGEN TRANSMISSION AND IMPROVING GAS BARRIER PROPERTY

The present application claims priority from Korean Patent Application No. 10-2008-16888, filed Feb. 25, 2008, the subject matter of which is incorporated herein by reference in its entirety.

FIELD OF THE INVENTION

The present invention relates to an organic/inorganic hybrid thin film passivation layer for blocking moisture and oxygen transmission of an organic electronic device fabricated on a substrate and improving the gas barrier property of a plastic substrate, and a fabrication method thereof.

BACKGROUND OF THE INVENTION

Organic electronic devices, such as organic light emitting diodes (OLEDs), organic thin-film transistors (OTFTs), solar cells, and other organic material-containing devices, have been attracting a great deal of interest as the devices of the next generation. For such organic electronic devices to be commercialized, high quality passivation layers need to be developed in order to ensure the reliability of the device. The reliability of a device is directly related to the lifetime of the device. Most organic electronic devices that use organic materials are problematic in that they degrade easily by moisture, oxygen, and light existing in the atmosphere and they show very low durability against heat, where their lifetime decreases with a rise in temperature. Accordingly, various methods for blocking the degradation and deterioration of organic materials by moisture and oxygen are being developed.

Among those methods, research on passivation layers for OLEDs has been actively underway. Korean Patent Publication No. 2002-22250 discloses a method of protecting a device by covering its surface with a metal cap or a glass cap in a structure, as illustrated in FIG. 1. In particular, FIG. 1 shows a structure of a prior art organic electroluminescence device, including an anode glass substrate 1, a hole injection layer 2, a hole transfer layer 3, a light emitting layer 4, an electron transfer layer 5, an electron injection layer 6 and a cathode electrode 7, whose surface is covered with a steel use stainless can or a glass lid 9 containing a humectant 8 and sealed with a sealing agent, such as photocurable epoxy. However, since the method is incapable of completely blocking moisture and oxygen transmission after the fabrication of an organic device, there is an urgent need to establish complementary measures. Further, in case of a large area device (30 inches or more), limitations exist with respect to consistent processing schemes and application of the device.

Korean Patent Publication No. 1999-49287 discloses a method of applying ceramic materials, such as $Al_2O_3$, MgO, BeO, SiC, $TiO_2$, $Si_3N_4$, $SiO_2$ and the like, to a passivation layer. However, the method has several disadvantages in that a high temperature is required for carrying out the process and it is difficult to expect properties that are better than the physical properties of the ceramic materials themselves. Korean Patent No. 540179 discloses a method of fabricating an organic electroluminescence device having an inorganic composite thin layer containing a mixture of $SiO_2$ and MgO at a constant ratio as a passivation layer, where the inorganic composite thin layer is deposited on the surface of the device. FIG. 2 illustrates such an inorganic composite thin layer 11 deposited on the device of FIG. 1, as an alternative to the can or lid 9 of FIG. 1. While such a method is capable of lowering the water vapor transmission rate (WVTR) and oxygen transmission rate (OTR) by applying a single inorganic thin film passivation layer to a conventional organic electronic device, the method is problematic in that it is difficult to form a uniform layer and that there is a risk of lower uniformity against moisture and oxygen resistance due to the weak interfacial adhesion strength, which also results in surface light scattering and the deterioration in light transmission.

Meanwhile, plastic substrates require characteristics, such as low profile/small form factor, impact resistance, low thermal expansion rate, and high gas barrier property. The primary issue with applying plastic substrates to display and organic electronic devices is developing a technique for improving the gas barrier property so as to block the transmission of atmospheric gas, such as moisture and oxygen. Plastic substrates made of polymer resin have the advantage of being flexible, but they are problematic in that it is easy for gases, such as moisture and oxygen, to penetrate thereinto because of their inherent properties different from a glass substrate, and they show very weak chemical resistance to a variety of chemical products including various solvents. In order to fabricate a highly functional plastic substrate, the substrate surface must be protected with a substance which exhibits very low moisture and oxygen transmission rates and a high resistance to various chemicals. Further, in order for the plastic substrate to block moisture and oxygen transmission, the thermal stress between the plastic substrate and the ceramic passivation layer must be reduced, and microparticles have to adhere and accumulate on the substrate surface while reducing the surface roughness of the substrate. In order to achieve the above objective, there is a need to develop a passivation multilayer technique of repeatedly laminating an organic material capable of being planarized and a ceramic inorganic material having strong protective properties.

The present inventors have thus endeavored to overcome the problems in the prior art and develop an organic/inorganic hybrid thin film passivation layer. The hybrid thin film passivation layer includes an organic polymer passivation layer made of a photocurable polymer according to a UV/ozone ($O_3$) curing process which is capable of improving surface energy and forming a more delicate surface structure compared to that made by a conventional UV curing process, and an inorganic thin film passivation layer prepared by using a nanocomposite material mixed with two or more inorganic materials in an up-and-down laminated structure. The organic/inorganic hybrid thin film passivation layer of the present invention can effectively block oxygen and moisture transmission, ensuring the stability and reliability of a device and improve the gas barrier property of a plastic substrate.

SUMMARY OF THE INVENTION

The primary objective of the present invention is to provide an organic/inorganic hybrid thin film passivation layer capable of effectively blocking oxygen and moisture transmission, to ensure the stability and reliability of a device fabricated on a substrate and improve the gas barrier property of a plastic substrate, as well as a fabrication method thereof.

In accordance with one embodiment of the present invention, there is provided an organic/inorganic hybrid thin film passivation layer for blocking oxygen and moisture transmission of an organic electronic device fabricated on a substrate and improving the gas barrier property of a plastic substrate. The hybrid thin film passivation layer includes an organic polymer passivation layer made of a photocurable polymer according to a UV/ozone curing process and an inorganic thin film passivation layer prepared by using a nanocomposite material containing at least two inorganic materials, and has an up-and-down laminated structure of the organic polymer passivation layer and inorganic thin film passivation layer.

In accordance with another embodiment of the present invention, a method of fabricating an organic/inorganic hybrid thin film passivation layer having the above characteristics by a UV/ozone curing process is provided.

BRIEF DESCRIPTION OF THE DRAWINGS

The embodiments of the present invention will be described in detail with reference to the following drawings.

FIG. 7(a) shows the surface of a MS-31 inorganic thin film passivation layer, while FIG. 7(b) shows the surface of an acrylate resin organic polymer passivation layer. FIG. 7(c) shows the cross-section of an inorganic/organic hybrid thin film passivation layer, while FIG. 7(d) shows the cross-section of an organic/inorganic hybrid thin film passivation layer.

DETAILED DESCRIPTION OF THE INVENTION

Figure 1:
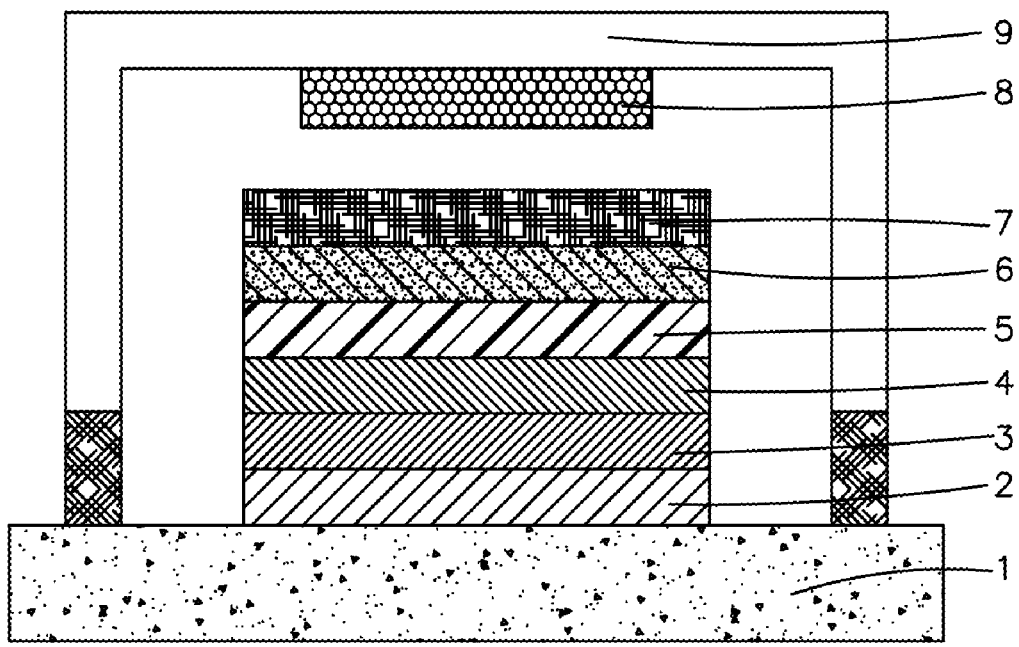
FIG. 1 is a schematic diagram illustrating the structure of a prior art organic electronic device sealed with a metal cap.
Figure 2:
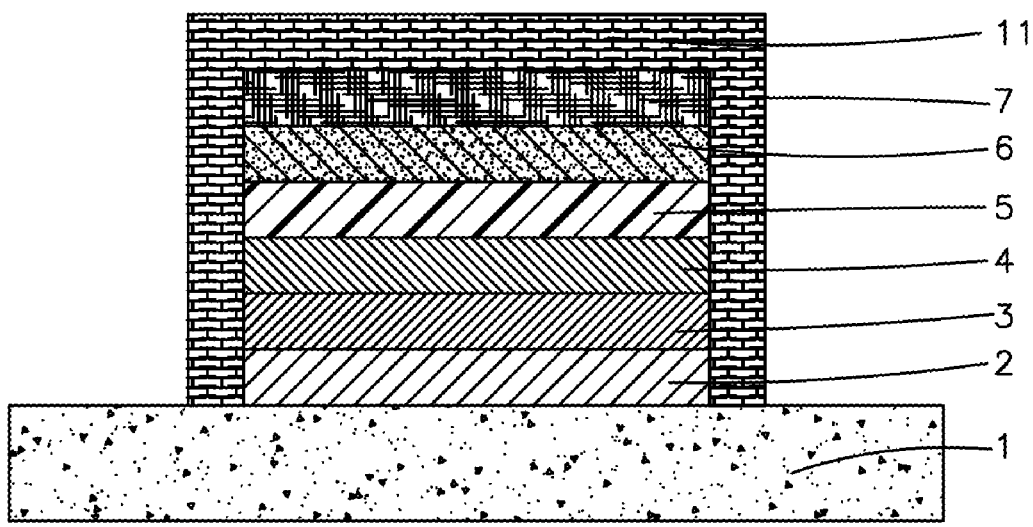
FIG. 2 is a schematic diagram illustrating the structure of a prior art organic electronic device on which an inorganic composite thin film is deposited as a passivation layer.

The organic/inorganic hybrid thin film passivation layer according to the present invention is characterized as including an organic polymer passivation layer made of a photocurable polymer according to a UV/ozone curing process and an inorganic thin film passivation layer prepared by using a nanocomposite material containing at least two inorganic materials and having a up-and-down laminated structure of the organic polymer passivation layer and inorganic thin film passivation layer.

In particular, the organic/inorganic hybrid thin film passivation layer according to the present invention may be fabricated by the following steps:
1) coating an organic electronic device fabricated on a substrate or the top or both the top and bottom of a plastic substrate with a photocurable polymer;
2) curing the coated photocurable polymer by UV/ozone ($UV/O_3$) irradiation to form an organic polymer passivation layer; and
3) depositing a nanocomposite material containing at least two inorganic materials on the organic polymer passivation layer to form an inorganic thin film passivation layer.

Step 1) above is for securing the stability and reliability of an organic electronic device fabricated on a substrate and for improving the gas barrier property of a plastic substrate by effectively blocking moisture and oxygen transmission through the formation of a passivation layer. In step 1), a photocurable polymer is coated on the surface of the organic electronic device fabricated on a substrate or on the top or both the top and bottom of a plastic substrate. The application of the photocurable polymer in the present invention is carried out by using conventional methods in the art, such as spin coating, screen printing, bar coating, inkjet printing, dipping and the like. In some embodiments of the present invention, the photocurable polymer may be applied to the organic electronic device fabricated on the substrate or the plastic substrate to the extent that it covers the top or both the top and bottom of the substrate. In certain embodiments, the photocurable polymer may be coated to have an average thickness of about 0.1 to about 10 μm.

Any type of photocurable polymer may be used in the present invention, as long as it can be cured by light (UV) irradiation. Suitable photocurable polymers may include, but are not limited to, epoxy resins, acrylate resins, thermal curable polyimide, polyethylene, and the like.

Suitable substrates to which the organic/inorganic hybrid thin film passivation layer is applied according to the present invention include, but are not limited to, a flexible substrate and a glass substrate. Examples of the flexible substrate may include polyethylene terephthalate (PET), polymethyl methacrylate (PMMA), polycarbonate (PC), polyethylene sulfone (PES) and the like. The organic electronic devices fabricated on such substrates can be of any kind, so long as they are composed of conventional organic materials well known in the art. Representative examples of such organic electronic devices may include OLED, OTFT, solar cells, other devices containing organic materials as a major component, and the like.

Suitable plastic substrates for use in the present invention may include any substrate made of polymer materials widely used as a display substrate, such as polyethersulfone, polycarbonate, polyethylene terephthalate, polyimide and the like. Further, any kind of plastic substrate, if it is conventionally used in the art, may be used in the present invention without limitation. Among various plastic substrates, however, polyethersulfone substrates have the advantage of high transparency.

Step 2) above is for forming an organic polymer passivation layer by curing the photocurable polymer coated on the surface of the organic electronic device fabricated on the substrate or on the top or both the top and bottom of the plastic substrate with UV/ozone (UV/$O_3$) irradiation having a short wavelength.

The UV/ozone curing process of step 2) consists of pre-curing, UV/ozone irradiation, and heat curing. First, the photocurable polymer coated in step 1) is subjected to pre-curing by using a hot plate or an oven at a temperature of 70 to 90° C. for 2 to 5 min so that the additives and/or impurities included in the photocurable polymer, such as acrylate resin, are gradually removed. Then, the pre-cured photocurable polymer is irradiated with UV/ozone to carry out a light curing process. During the light curing process by a UV/ozone irradiation, oxygen ($O_2$) molecules are degraded into an atomic state by irradiating the photocurable polymer with a light source having a wavelength of 170 to 200 nm for 1 to 7 min, followed by irradiation of the generated oxygen atoms with a light source having a wavelength 240 to 260 nm for 1 to 7 min, resulting in ozone generation. The major wavelength of the light source which directly influences the curing efficiency is in the range of from 240 to 260 nm, and the irradiated light source energy is in the range of from 2400 to 3000 mJ/cm$^2$. Finally, the photocurable polymer is subjected to heat curing by using an oven at a temperature of 100 to 120° C. for 1 to 2 hr, thereby forming an organic polymer passivation layer. The UV/ozone curing process as described above can significantly increase the hardness of an organic polymer passivation layer, as compared with a curing process that uses only UV, and remarkably improve its function as a passivation layer through an increase in interfacial adhesion strength.

In certain embodiments of the present invention, the coated photocurable polymer from step 1) is subjected to pre-curing by using a hot plate at 80° C. for 3 min, followed by irradiation with a light source having a wavelength of 184.9 nm for 5 min to degrade oxygen ($O_2$) molecules into oxygen atoms. Then, in order to generate ozone from the oxygen atoms, a UV/ozone curing process is carried out by irradiating with a light source having a wavelength of 253.7 nm for 5 min. The major wavelength of the light source which directly influences the curing efficiency is 253.7 nm, and the irradiated light source energy is 2800 mJ/cm$^2$. After the UV/ozone curing process is completed, the photocurable polymer is finally subjected to heat curing by using an oven at 120° C. for 2 hr, which results in the formation of an organic polymer passivation layer.

Step 3) above is for depositing a nanocomposite material containing at least two inorganic materials on the organic polymer passivation layer formed in step 2) so as to form an inorganic thin film passivation layer.

In the above step, an organic/inorganic hybrid thin film passivation layer according to the present invention is fabricated by depositing a nanocomposite material containing at least two inorganic materials on the organic polymer passivation layer formed on the surface of an organic electronic device fabricated on a flexible substrate or a glass substrate, or on the top or both the top and bottom of a plastic substrate by using an electron beam evaporator, a sputter, a physical vapor deposition (PVD), a chemical vapor deposition (CVD), an atomic layer deposition (ALD) and the like, resulting in the formation of an inorganic thin film passivation layer. The inorganic thin film passivation layer may be deposited to have an average thickness of, for example, 0.1 to 0.5 μm.

The nanocomposite material used in the present invention is a mixture containing at least two inorganic materials selected from the group consisting of metal oxides, non-metal oxides, nitrides and salts, e.g., aluminum oxides (e.g., $Al_2O_3$), silicone oxides (e.g., $SiO_2$), silicone nitrides (e.g., SiNx), silicone oxidenitrides (e.g., SiON), magnesium oxides (e.g., MgO), indium oxides (e.g., $In_2O_3$), magnesium fluorides (e.g., $MgF_2$), and the like.

The inorganic thin film passivation layer formed in the above step can improve the resistance properties against moisture and oxygen by blocking the paths for moisture and oxygen transmission which can be generated by defects (e.g., pinholes, grain boundaries and cracks) on the organic polymer passivation layer formed in steps 1) and 2).

An organic/inorganic hybrid thin film passivation layer having a multi-layer laminate structure repeatedly including more than one pair of the organic polymer passivation layer and inorganic thin film passivation layer may be fabricated by depositing the organic polymer passivation layer and inorganic thin film passivation layer one by one repeatedly. Further, it is also possible to carry out step 3) before steps 1) and 2) by first forming an inorganic thin film passivation layer on the surface of the organic electronic device fabricated on the flexible substrate or the glass substrate, or on the top or both the top and bottom of a plastic substrate, followed by depositing an organic polymer passivation layer thereon, to thereby fabricate an inorganic/organic hybrid thin film passivation layer. Alternatively, more than one pair of the inorganic thin film passivation layer and organic polymer passivation layer prepared in the above order can be laminated repeatedly to fabricate an inorganic/organic hybrid thin film passivation layer having a multi-layer laminate structure.

As described above, the organic/inorganic hybrid thin film passivation layer in accordance with the present invention may have a structure where the order in which the organic polymer passivation layer and inorganic thin film passivation layer is laminated is reversed or a structure where more than one pair of the organic polymer passivation layer and inorganic thin film passivation layer is laminated in a multi-layer structure, both of which being capable of effectively blocking moisture and oxygen transmission.

The method of fabricating an organic/inorganic hybrid thin film passivation layer according to the present invention has the following characteristics.

First, the method in accordance with the present invention uses a UV/ozone curing process to form an organic polymer passivation layer which is capable of blocking moisture and oxygen transmission more efficiently than that prepared by conventional UV curing processes. The UV/ozone curing process can increase the surface energy of the organic polymer passivation layer and induce the surface to become hydrophilic, leading to an enhancement of adhesion strength between the organic polymer passivation layer and the upper passivation layer. Further, the method of the present invention enables the formation of passivation layers having a larger area than the area of the respective organic electronic device and repetitive passivation layers as well as passivation layers covering the overall surface thereof, resulting in the effective blocking of the transmission channels of moisture and oxygen that may penetrate into a large area organic light emitting device in a perpendicular and/or a horizontal direction.

Therefore, the method of the present invention can improve the stability and reliability of the device.

Second, the organic polymer passivation layer, whose surface has become hydrophilic by the UV/ozone curing process, shows high moisture-absorbing properties and is capable of absorbing any residual moisture to its surface, thereby minimizing damages to the device due to moisture transmission.

Third, the organic polymer passivation layer prepared by the UV/ozone curing process of the present invention exhibits a strong crosslinking effect and is capable of blocking the transmission channels of moisture and oxygen that may penetrate in a perpendicular direction and efficiently lowering moisture and oxygen transmission.

Fourth, the method of the present invention can fabricate an organic/inorganic hybrid thin film passivation layer capable of efficiently blocking moisture and oxygen transmission by depositing an inorganic thin film passivation layer made of a nanocomposite material containing at least two inorganic materials on the organic polymer passivation layer prepared above.

The organic/inorganic hybrid thin film passivation layer in accordance with the present invention having the characteristics described above can effectively block moisture and oxygen transmission, and is thus useful for securing the stability and reliability of the organic electronic device and improving the gas barrier property of the plastic substrate.

Hereinafter, the characteristics of the organic/inorganic hybrid thin film passivation layer according to the present invention will be explained in more detail with reference to the accompanying drawings.

Figure 3:
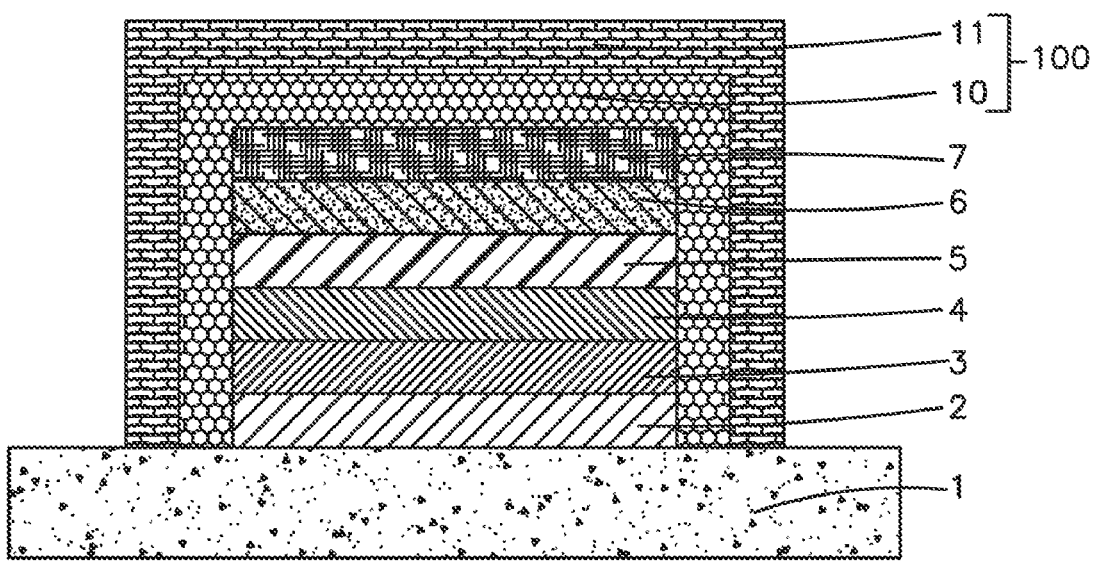
FIG. 3 is a schematic diagram illustrating the structure of an organic electronic device fabricated on a substrate to which an organic/inorganic hybrid thin film passivation layer according to the present invention is applied.

FIG. 3 is a schematic diagram illustrating the structure of an organic electronic device fabricated on a substrate to which an organic/inorganic hybrid thin film passivation layer 100 according to the present invention is applied. The overall surface of the organic light emitting device includes an anode glass substrate 1, a hole injection layer 2, a hole transfer layer 3, a light emitting layer 4, an electron transfer layer 5, an electron injection layer 6 and a cathode electrode 7, and is covered with an organic polymer passivation layer 10 and an inorganic thin film passivation layer 11. Here, the organic polymer passivation layer 10 is formed by using acrylate resin as a photocurable polymer, and the inorganic thin film passivation layer 11 is deposited thereon by using a nanocomposite material in which magnesium oxide and silicone oxide are mixed in an appropriate ratio, for example, MS-31 (MgO:$SiO_2$=3:1 wt %). The organic/inorganic hybrid thin film passivation layer 100 applied to the organic light emitting device can complement the mutual defects between the organic polymer passivation layer 10 and inorganic thin film passivation layer 11, and thereby, effectively block moisture and oxygen transmission.

Figure 4:
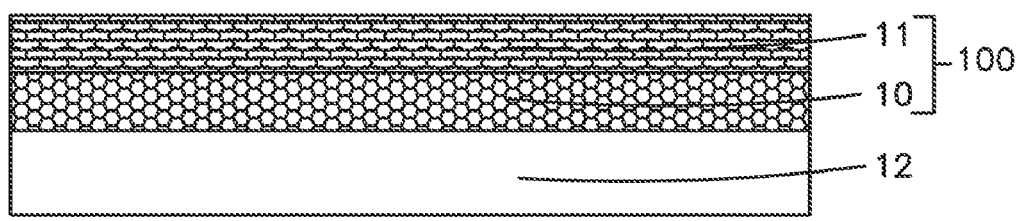
FIG. 4 is a schematic diagram illustrating the structure of a plastic substrate to which an organic/inorganic hybrid thin film passivation layer according to the present invention is applied.
Figure 5:
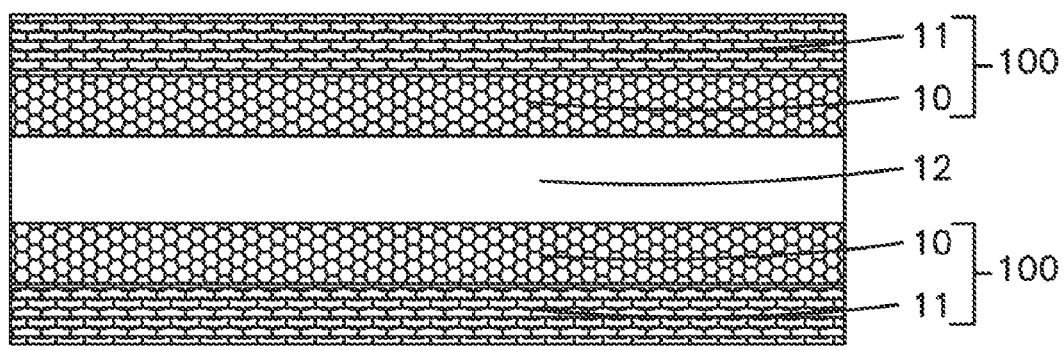
FIG. 5 is a schematic diagram illustrating the structure of a plastic substrate where an organic/inorganic hybrid thin film passivation layer prepared by a UV/ozone curing process according to the present invention is applied to both the top and bottom of the substrate.

FIG. 4 is a schematic diagram illustrating the structure of a plastic substrate 12 to which the organic/inorganic hybrid thin film passivation layer 100 according to the present invention is applied, while FIG. 5 is a schematic diagram illustrating the structure of a plastic substrate 12 where the organic/inorganic hybrid thin film passivation layer 100 prepared by a UV/ozone curing process according to the present invention is applied to both the top and bottom of the substrate. The organic/inorganic hybrid thin film passivation layer 100 applied to the plastic substrate 12 can effectively block moisture and oxygen transmission, and thereby further improve the gas barrier property.

Figure 6:
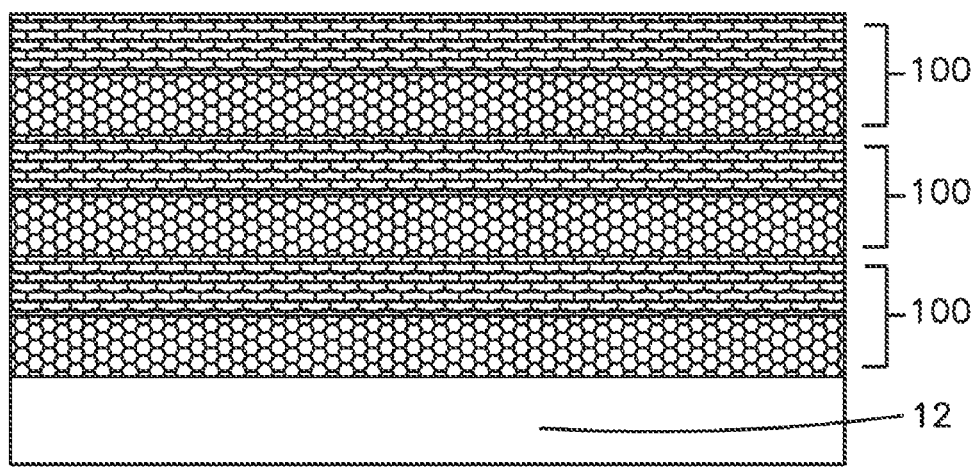
FIG. 6 is a schematic diagram illustrating the structure of a plastic substrate to which an organic/inorganic hybrid thin film passivation layer prepared by a UV/ozone curing process according to the present invention is repeatedly applied to result in a multilayer structure.

FIG. 6 is a schematic diagram illustrating the structure of a plastic substrate 12 to which an organic/inorganic hybrid thin film passivation layer 100 prepared by the UV/ozone curing process according to the present invention is repeatedly applied to result in a multilayer structure. The plastic substrate exhibits a superior effect in blocking moisture and oxygen transmission and an improved gas barrier property.

Figure 7A:
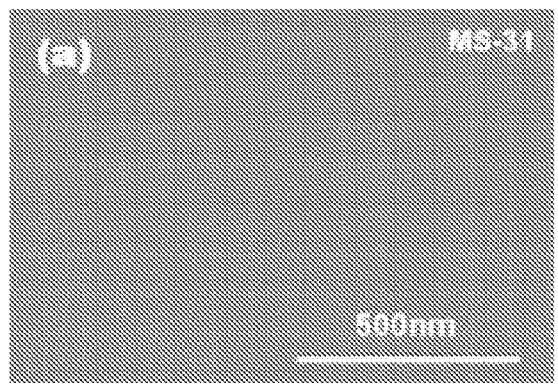
FIGS. 7(a)-7(d) show scanning electron microscope (SEM) photographs of the cross-sections and surfaces of the organic/inorganic hybrid thin film passivation layer according to the present invention.
Figure 7B:
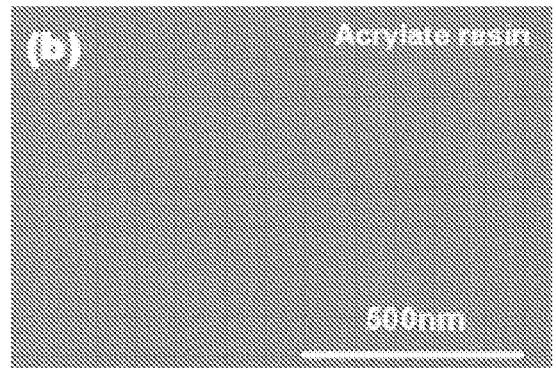
Figure 7C:
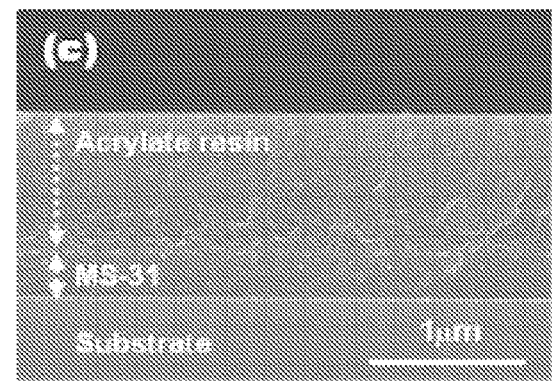
Figure 7D:
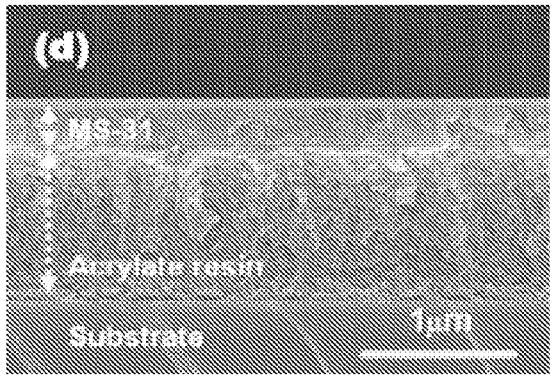

FIGS. 7(a)-(d) are scanning electron microscope (SEM) photographs of the cross-sections and surfaces of the organic/inorganic hybrid thin film passivation layer according to the present invention. FIG. 7(a) shows the surface of an inorganic thin film passivation layer in the organic/inorganic hybrid thin film passivation layer according to the present invention, confirming that the inorganic thin film passivation layer is in a high amorphous state where there are almost no grains serving as channels for transmission of moisture and oxygen. FIG. 7(b) shows the surface of an organic polymer passivation layer in the organic/inorganic hybrid thin film passivation layer according to the present invention, demonstrating that pinholes or pores are not formed on the surface thereof and that the organic polymer passivation layer is uniformly coated on a substrate. FIG. 7(c) shows the cross-section of the organic/inorganic hybrid thin film passivation layer according to the present invention which has a structure of an inorganic thin film passivation layer formed on a substrate and an organic polymer passivation layer deposited thereon. In contrast to FIG. 7(c), FIG. 7(d) shows the cross-section of a structure of an organic polymer passivation layer formed on a substrate and an inorganic thin film passivation layer deposited thereon. Although both the organic polymer passivation layer and inorganic thin film passivation layer are heterogeneous thin film materials, they are found to be fabricated in a very close-packed form due to the strong interfacial adhesion strength between them.

The adhesion strengths between the interfaces of the organic/inorganic hybrid thin film passivation layer prepared by the UV/ozone curing process according to the present invention are measured according to the method described in ASTM 3359-93B and compared with the adhesion strength of a conventional hybrid thin film passivation layer prepared by a UV curing process. The results are shown in Table 1 below.

TABLE 1

| Lower layer material | Upper layer material | | |
| --- | --- | --- | --- |
|  | MS-31 | Acrylate resin cured by UV | Acrylate resin cured by UV/$O_3$ |
| Glass | 92% | 3% | 4% |
| PES | 98% | 65% | 96% |
| ITO | 71% | 2% | 3% |
| MS-31 | x | 7% | 37% |
| Acrylate resin cured by UV | 93% | x | x |
| Acrylate resin cured by UV/$O_3$ | 98% | x | x |

As shown in Table 1, the organic/inorganic hybrid thin film passivation layer prepared by the UV/ozone curing process of the present invention exhibits higher adhesion strength between the passivation layer interfaces than that prepared by the conventional UV curing process, and those unique characteristics are found to effectively block moisture and oxygen that may penetrate from a perpendicular and horizontal directions.

Figure 8:
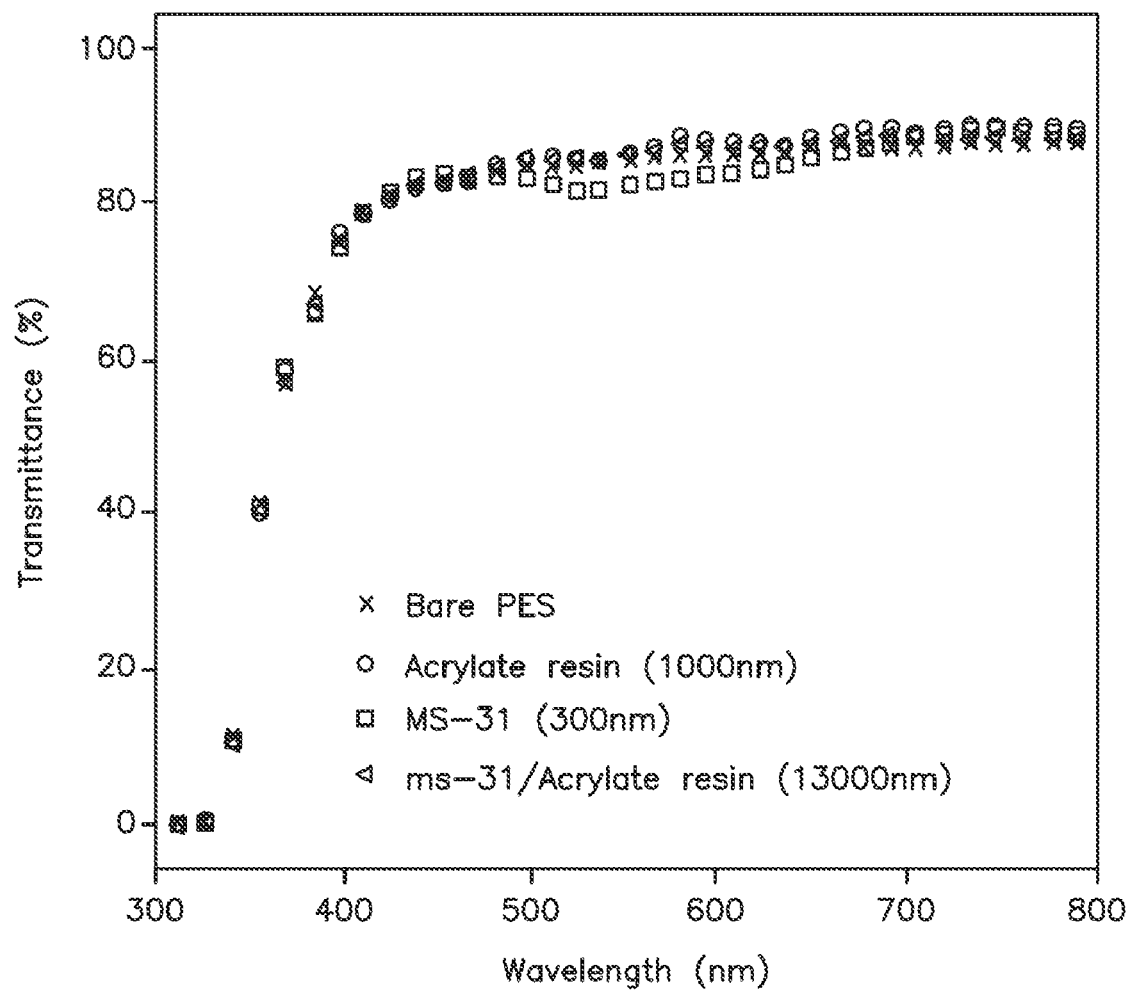
FIG. 8 is a graph showing the UV-visible light transmission rate of an organic/inorganic hybrid thin film passivation layer prepared by a UV/ozone curing process according to the present invention.
Figure 9A:
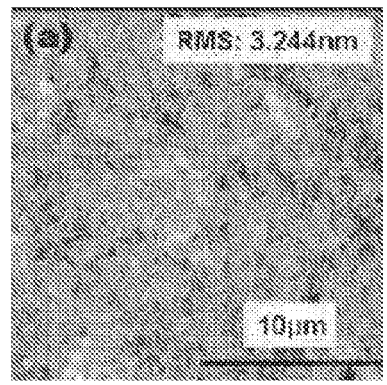
FIGS. 9(a)-9(d) show atomic force microscope (AFM) photographs of surface planarization of an organic polymer passivation layer when a photocurable polymer undergoes a UV curing process for 1.5 min (FIG. 9(a)), a UV/ozone curing treatment for 1.5 min (FIG. 9(b)), a UV/ozone curing treatment for 3 min (FIG. 9(c)), and a UV/ozone curing treatment for 5 min (FIG. 9(d)) according to the present invention.
Figure 9B:
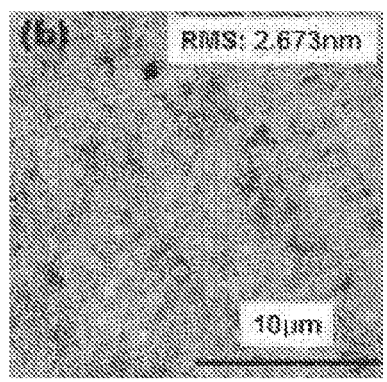
Figure 9C:
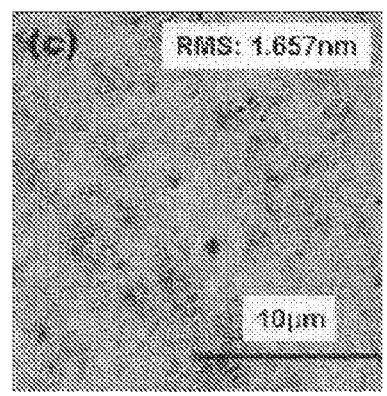
Figure 9D:
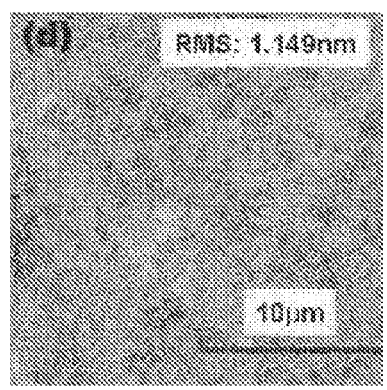

FIG. 8 is a graph showing the UV-visible light transmission rate of each constituent of the organic/inorganic hybrid thin film passivation layer according to the present invention. As shown in FIG. 8, the light transmission rate of each constituent is 80% or more, which suggests that the organic/inorganic hybrid thin film passivation layer of the present invention can be effectively used as a passivation layer for a top emissive type organic light emitting device.

FIGS. 9(a)-(d) show atomic force microscope (AFM) photographs of the surface planarization of the organic polymer passivation layer when the photocurable polymer undergoes a UV/ozone curing process for different amounts of time. The UV/ozone apparatus used herein exhibits an etching speed of 5 nm/min for an organic material, leading to surface planarization caused by a difference in relative etching speeds between surfaces at higher and lower altitudes in the polymer thin film. As shown in FIGS. 9(a)-(d), in a conventional UV curing process, the mean roughness was 3.244 nm (FIG. 9(a)), but after undergoing the UV/ozone process for 1.5 min (FIG. 9(b)), 3 min (FIG. 9(c)) and 5 min (FIG. 9(d)), the mean roughness is improved to 1.149 nm. The improved surface roughness of the organic polymer passivation layer makes it possible to fabricate a passivation layer having a uniform thin film thickness as shown in FIG. 6 when fabricating a passivation layer in a multilayer structure, and can improve the light transmission by minimizing light scattering at the interface.

Figure 10:
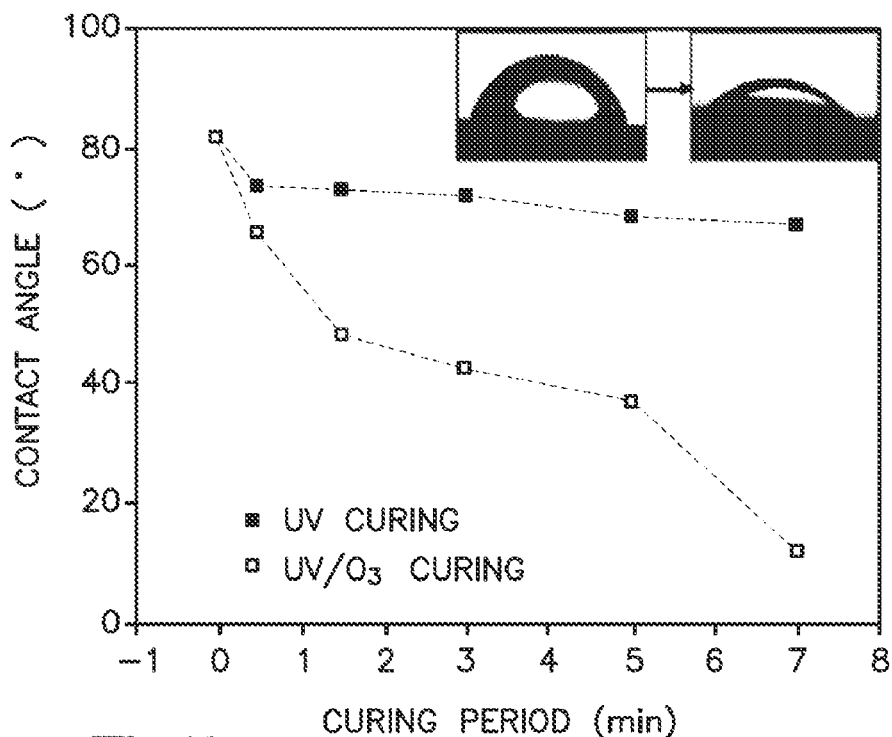
FIG. 10 is a graph showing the change in surface contact angles of an organic polymer passivation layer when a photocurable polymer undergoes UV/ozone curing according to the present invention for different lengths of time.

FIG. 10 is a graph showing the change in surface contact angles of an organic polymer passivation layer depending on the length of the UV/ozone curing time. As shown in FIG. 10, compared to the conventional UV curing process, the UV/ozone curing process of the present invention is found to convert a hydrophobic surface into a hydrophilic one within a short time. A decrease in contact angle in the conventional UV curing process occurs because a very small amount of ozone generated during the UV irradiation forms a number of hydrophilic groups at the surface. However, the number of the hydrophilic groups is too small to induce a drastic change in surface polarity. On the other hand, in the UV/ozone curing process according to the present invention, the lamp installed in the UV/ozone apparatus has high energy due to a short wavelength and can thus break the molecular binding, thereby generating a large amount of ozone within the first 3 to 5 sec. The amount of ozone thus generated is much more than that generated by a single irradiation with UV, and since the ozone and UV generated in the apparatus are cured, the surface polarity was found to change into hydrophilic despite the short-time curing. The above converted surface of the organic polymer passivation layer can enhance the adhesion strength between the upper and lower interfaces and improve surface roughness, as mentioned above.

Figure 11:
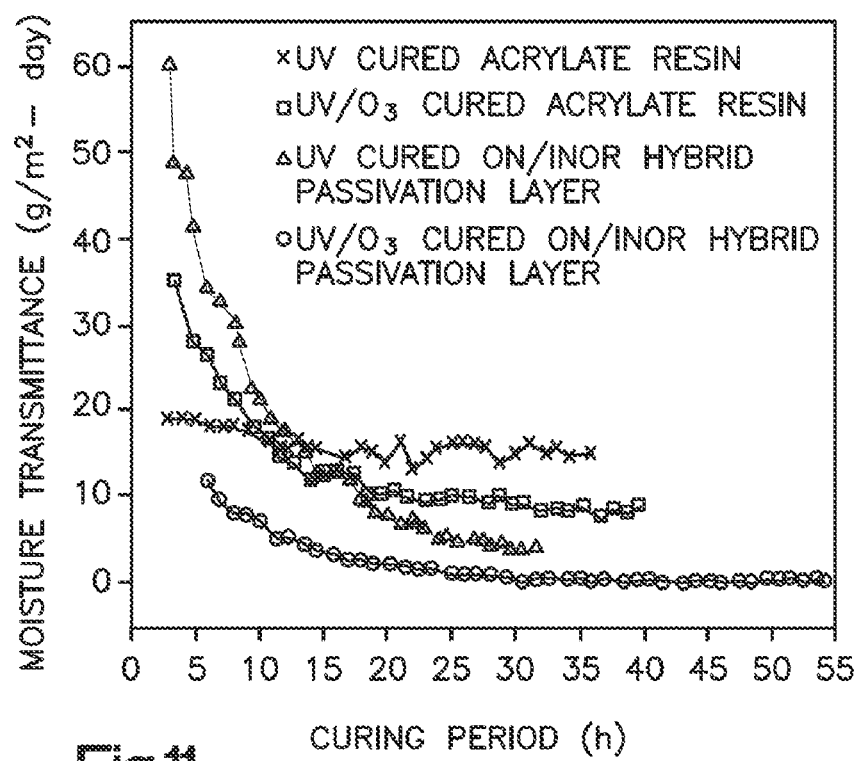
FIG. 11 is a graph comparing the moisture transmission rates of an organic polymer passivation layer prepared by a UV/ozone curing process according to the present invention to those of that prepared by a conventional UV curing process.

FIG. 11 is a graph comparing the moisture transmission rates of an acrylate polymer passivation layer cured by UV/ozone and an organic/inorganic hybrid thin film passivation layer comprising the same with an acrylate polymer passivation layer cured by UV and an organic/inorganic hybrid thin film passivation layer comprising the same. As a result, it has been found that when using the UV/ozone curing process according to the present invention instead of the conventional UV curing process, the moisture resistance of the organic/inorganic hybrid thin film passivation layer, as well as the single acrylate passivation layer, is significantly increased. This suggests that the organic/inorganic hybrid thin film passivation layer in accordance with the present invention can be effectively applied to a flexible organic light emitting device.

Figure 12A:
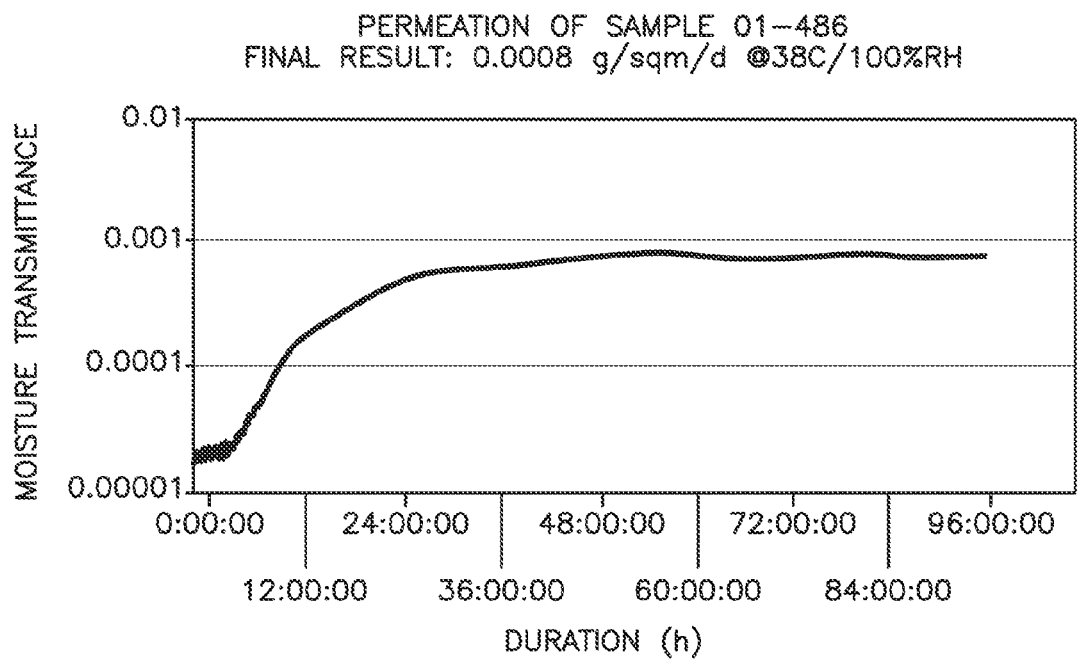
FIGS. 12a and 12b are graphs showing the moisture transmission rates of an organic/inorganic hybrid thin film passivation layer according to the present invention, on which an organic polymer passivation layer and an inorganic thin film passivation layer are repeatedly laminated in a three-layer structure and a six-layer structure, respectively.
Figure 12B:
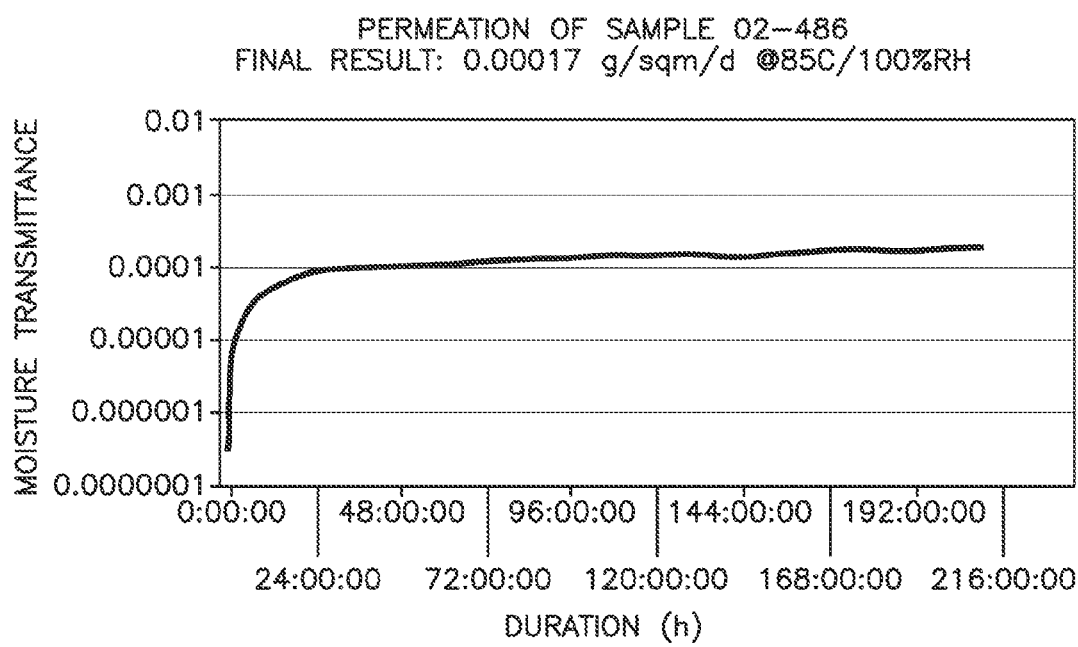

FIGS. 12a and 12b are graphs showing the moisture transmission rates of organic/inorganic hybrid thin film passivation layers having a structure where an organic polymer passivation layer prepared by a UV/ozone curing process and an inorganic thin film passivation layer containing a nanocomposite material are repeatedly laminated. FIG. 12a depicts the moisture transmission rate of the organic/inorganic hybrid thin film passivation layer in a three-layer laminate structure, and FIG. 12b depicts the moisture transmission rate of the organic/inorganic hybrid thin film passivation layer in a six-layer laminate structure. As such, it has been found that the organic/inorganic hybrid thin film passivation layer having such a multilayer laminate structure exhibits a significantly reduced moisture transmission rate, as compared with that having a two-layer laminate structure as shown in FIG. 11, and thereby exhibits a superior effect in blocking moisture transmission. In particular, while the organic/inorganic hybrid thin film passivation layer having a two-layer laminate structure exhibits a moisture transmission rate of $10^{-3}$, the organic/inorganic hybrid thin film passivation layer having a multilayer laminate structure exhibits a moisture transmission rate of $10^{-4}$ in case of a three-layer structure and that of $10^{-6}$ in case of a six-layer structure, demonstrating that the multi-layer laminate structure is more efficient in blocking moisture and oxygen transmission. These results suggest that when an organic/inorganic hybrid thin film passivation layer is fabricated by mixing an acrylate polymer material with a nanocomposite material having low moisture and oxygen transmission rates, a superior effect in blocking moisture and oxygen transmission can be expected and that such an effect can be further enhanced by the repetitive lamination of an organic/inorganic hybrid thin film passivation layer.

As described above, since the present invention provides a method of fabricating an organic/inorganic hybrid thin film passivation layer in a multilayer laminate structure including an organic polymer passivation layer prepared by a UV/ozone curing process using a short-wavelength light source, it is possible to form a closely packed thin film and improve the adhesion strength between the thin film interfaces, resulting in a significant enhancement in the resistance against moisture and oxygen transmission. Further, the UV/ozone curing process according to the present invention allows the surface planarization of the organic polymer passivation layer, thereby improving the resistance uniformity against moisture and oxygen transmission depending on the position of thus manufactured passivation layer and enhancing light transmission by minimizing surface light scattering. Therefore, if the organic/inorganic hybrid thin film passivation layer according to the present invention is used for the fabrication of a passivation layer of an organic electronic device, it can efficiently protect an organic layer of the device from moisture and oxygen, and thereby significantly contribute to the stability and reliability of the device. Further, the organic/inorganic hybrid thin film passivation layer according to the present invention can be effectively used for a plastic substrate so as to provide excellent gas barrier property.

While the present invention has been described and illustrated with respect to a preferred embodiment of the invention, it will be apparent to those skilled in the art that variations and modifications are possible without deviating from the broad principles and teachings of the present invention, which should be limited solely by the scope of the claims appended hereto.

What is claimed:

1. A method of fabricating an organic/inorganic hybrid thin film passivation layer for blocking moisture and oxygen transmission and improving gas barrier property comprising:
   coating an organic electronic device fabricated on a substrate or on a top or both the top and bottom of a plastic substrate with a photocurable polymer;
   curing the coated photocurable polymer by a UV/ozone ($UV/O_3$) process to form an organic polymer passivation layer; and depositing a nanocomposite material containing at least two inorganic materials on the organic polymer passivation layer to form an inorganic thin film passivation layer.

2. The method according to claim 1, wherein the photocurable polymer is selected from the group consisting of epoxy resins, acrylate resins, thermocurable polyimide and polyethylene.

3. The method according to claim 1, wherein the photocurable polymer is coated by spin coating, screen printing, bar coating, inkjet printing, or dipping.

4. The method according to claim 1, wherein the coated photocurable polymer has a thickness of 0.1 to 10 μm.

5. The method according to claim 1, wherein the organic electronic device is fabricated on a flexible substrate or a glass substrate.

6. The method according to claim 5, wherein the flexible substrate is made of a material selected from the group consisting of polyethylene terephthalate (PET), polymethyl methacrylate (PMMA), polycarbonate (PC), and polyethylene sulfone (PES).

7. The method according to claim 1, wherein the plastic substrate is made of a material selected from the group consisting of polyethersulfone, polycarbonate, polyethylene terephthalate and polyimide.

8. The method according to claim 1, wherein the UV/ozone process includes pre-curing, UV/ozone irradiation, and heat curing.

9. The method according to claim 8, wherein the pre-curing is carried out by treating the photocurable polymer at a temperature of 70 to 90° C. for 2 to 5 min.

10. The method according to claim 8, wherein the UV/ozone irradiation is carried out by irradiating the pre-cured photocurable polymer with a light source having an energy of 2400 to 3000 mJ/cm$^2$ at a wavelength range of 170 to 200 nm for 1 to 7 min to degrade oxygen molecules into oxygen atoms, followed by irradiation with a light source having an energy of 2400 to 2700 mJ/cm$^2$ at a wavelength range of 240 to 270 nm for 1 to 7 min to generate ozone from the oxygen atoms.

11. The method according to claim 8, wherein the heat curing is arried out by treating the UV/ozone irradiated photocurable polymer at a temperature of 100 to 120° C. for 1 to 2 hr.

12. The method according to claim 1, wherein the nanocomposite material is a mixture containing at least two inorganic materials selected from the group consisting of metal oxides, non-metal oxides, nitrides, and salts.

13. The method according to claim 12, wherein the nanocomposite material is a mixture containing at least two inorganic materials selected from the group consisting of aluminum oxides, silicone oxides, silicone nitrides, silicone oxidenitrides, magnesium oxides, indium oxides, and magnesium fluorides.

14. The method according to claim 12, wherein the depositing of the nanocomposite material is carried out by using an electron beam evaporator, a sputter, physical vapor deposition (PVD), chemical vapor deposition (CVD) or atomic layer deposition (ALD).

15. The method according to claim 1, wherein the deposited nanocomposite material has a thickness of 0.1 to 0.5 μm.

16. The method according to claim 1, wherein the coating, the curing, and the depositing are repeatedly carried out in order, so as to form a pair of the organic polymer passivation layer and inorganic thin film passivation layer in a multilayer laminate structure.

17. The method according to claim 1, wherein the depositing a nanocomposite material is carried out prior to the coating an organic electronic device and the curing the coated photocurable polymer, so as to form an inorganic thin film passivation layer before the deposition of the organic polymer passivation layer.

18. The method according to claim 17, wherein the coating, the curing, and the depositing are repeatedly carried out in order, so as to form a pair of the inorganic thin film passivation layer and organic polymer passivation layer in a multilayer laminate structure.

* * * * *